United States Patent [19]

Asher et al.

[11] 4,149,027
[45] Apr. 10, 1979

[54] TV GAME CARTRIDGE AND METHOD

[75] Inventors: James C. Asher, San Jose; Douglas A. Hardy, Portola Valley, both of Calif.

[73] Assignee: Atari, Inc., Sunnyvale, Calif.

[21] Appl. No.: 801,240

[22] Filed: May 27, 1977

[51] Int. Cl.² .................................................. H05K 5/00
[52] U.S. Cl. .................................. 174/52 R; 361/399; 339/42
[58] Field of Search ................. 361/395, 399; 339/41, 339/43, 42, 176 MP; 200/51.09; 174/52 R, 52 S

[56] References Cited
U.S. PATENT DOCUMENTS 1,271,478  7/1918  Krantz .................................... 339/43
4,095,791  6/1978  Smith et al. ........................... 361/399

Primary Examiner—David Smith, Jr.
Attorney, Agent, or Firm—Townsend and Townsend

[57] ABSTRACT

A cartridge for shielding a portable electronic microcircuit and for connecting the circuit into a TV game. The apparatus includes a circuit board that is protected within a housing from static electricity and is adapted for connection with an electrical connector on a TV game. The housing includes two parallel members for moving aside a protective shield on the electrical connector and thereby permitting engagement of the circuit board with the connector in the game.

11 Claims, 11 Drawing Figures

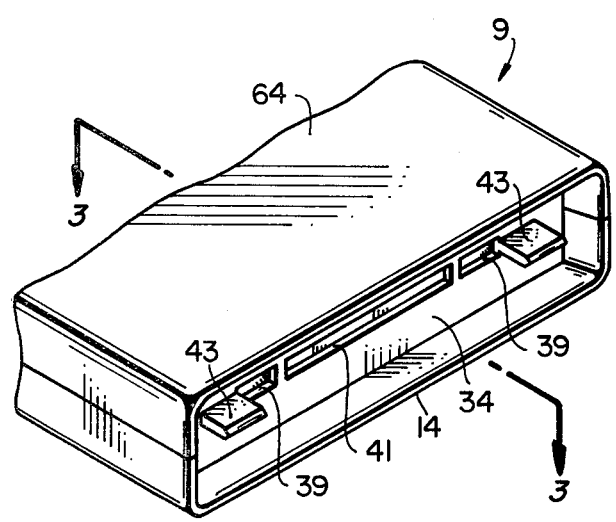
FIG_1
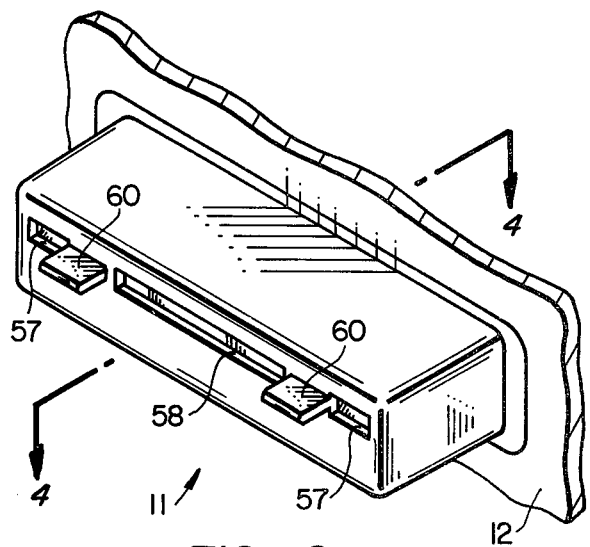
FIG_2
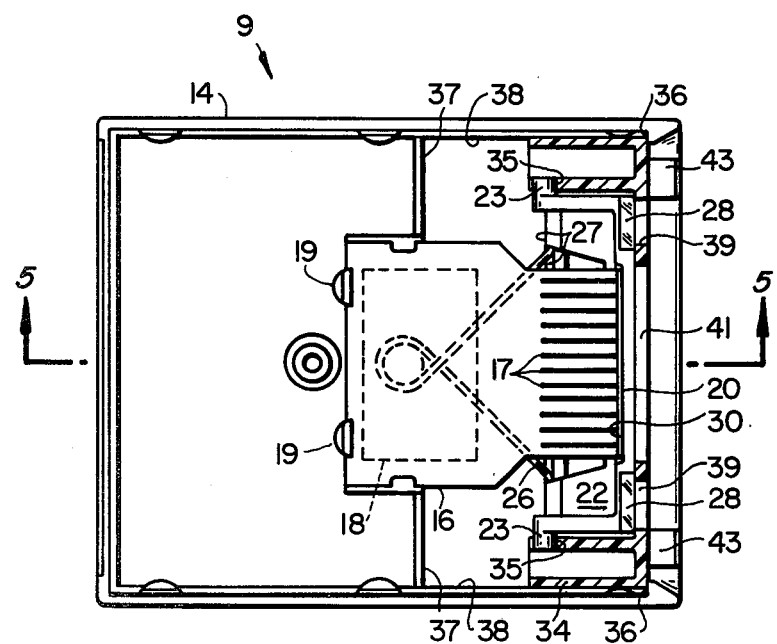
FIG_3
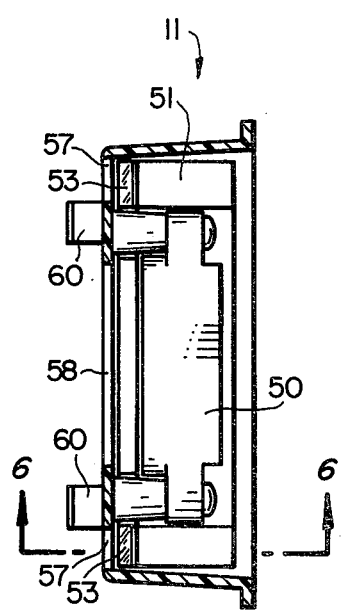
FIG_4
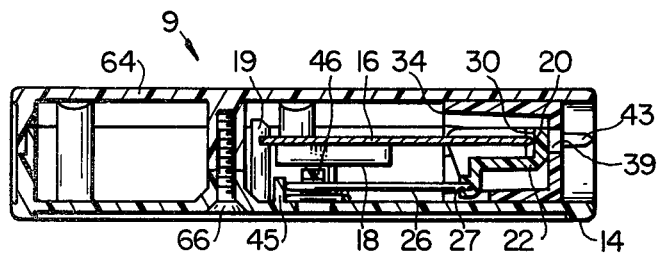
FIG_5
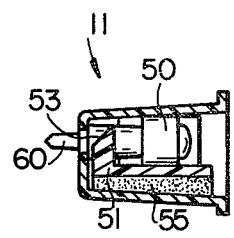
FIG_6

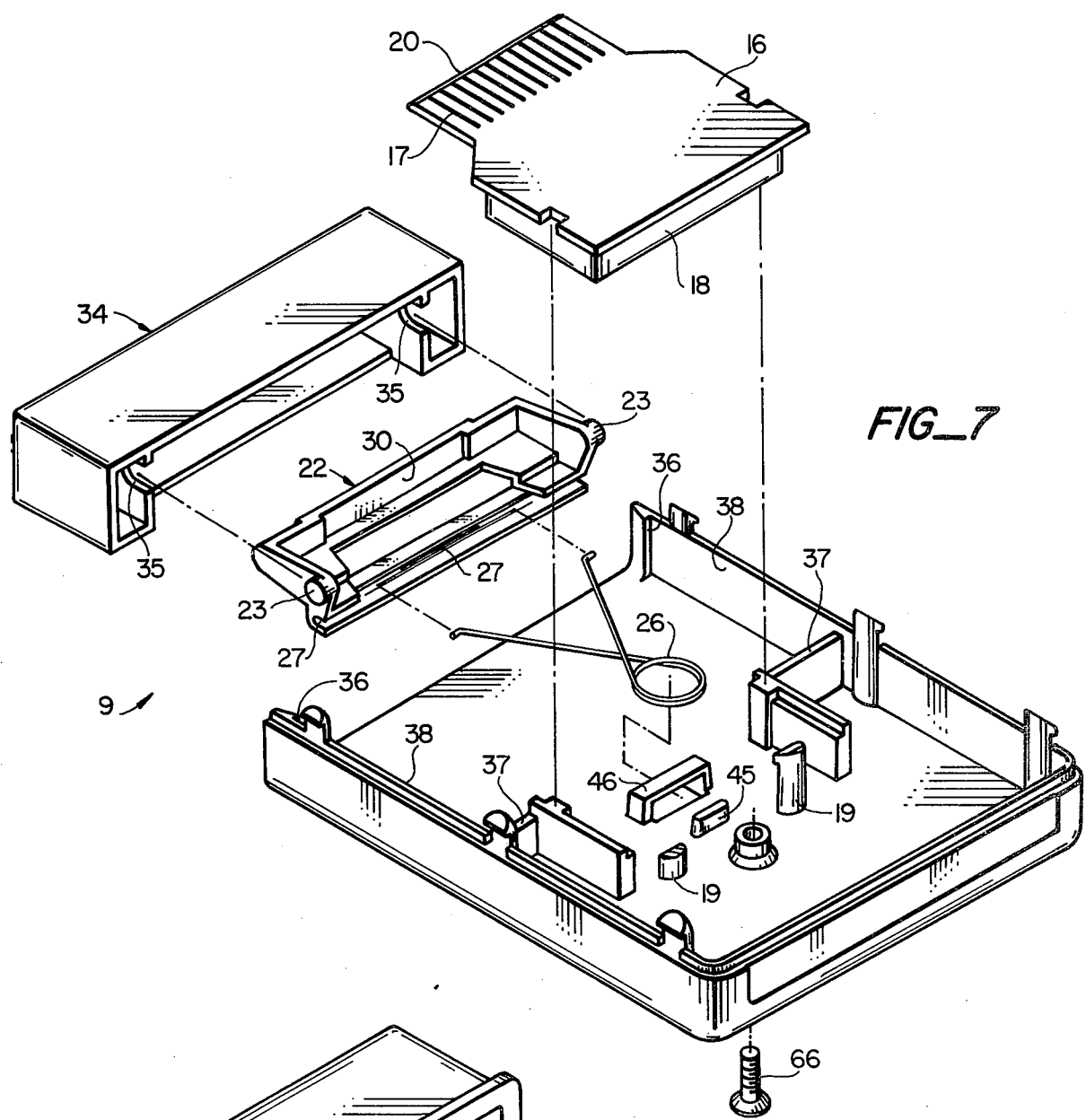
FIG_7
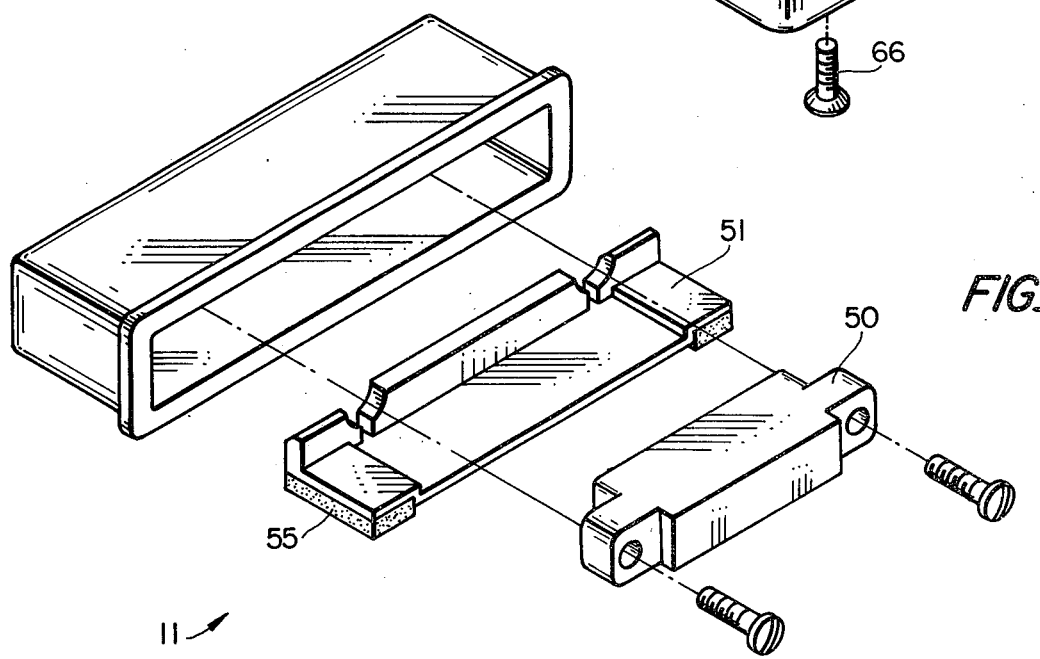
FIG_8

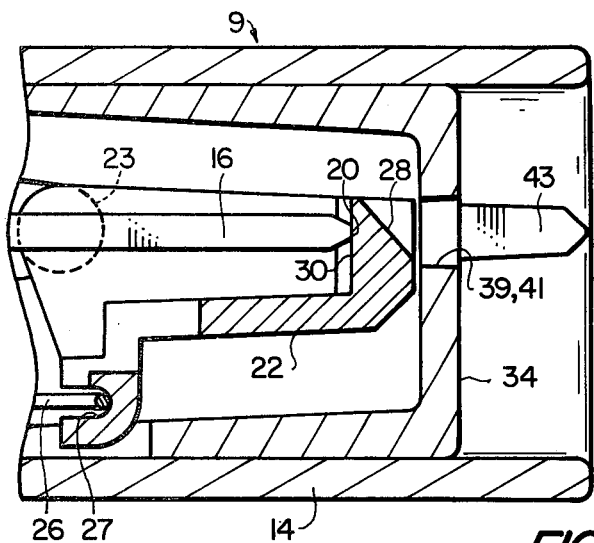
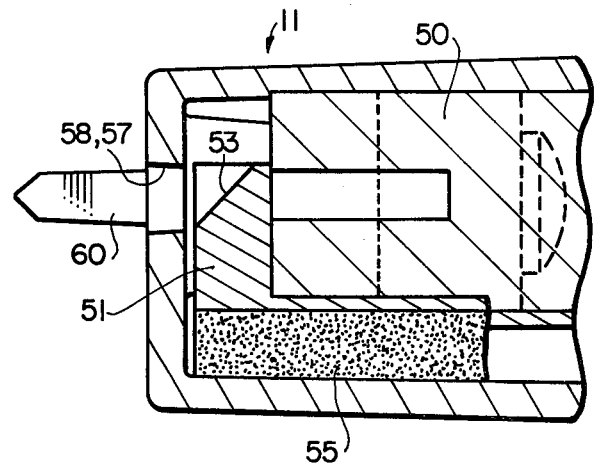
FIG_9a
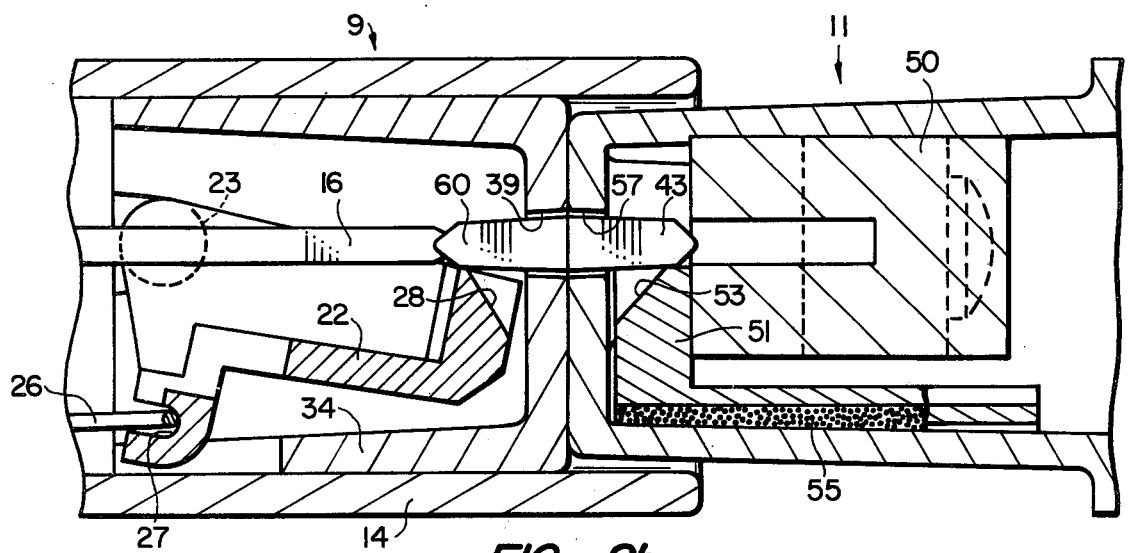
FIG_9b
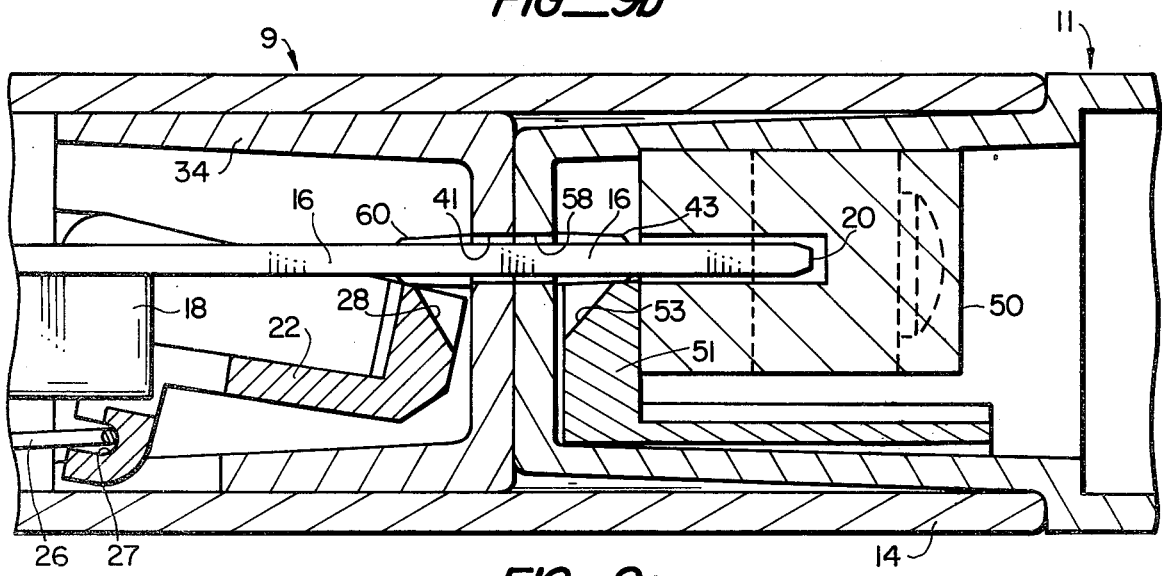
FIG_9c

TV GAME CARTRIDGE AND METHOD

BACKGROUND OF THE INVENTION

1. Field of the Invention

This invention generally relates to portable cartridges containing diversified input material for programming, being recorded upon, and/or operating such central components. Such cartridges are used in tape recorders, microfilm readers, motion picture cameras, and microprocessors.

2. Description of the Prior Art

Recently, the TV game industry began selling consumer video games with microprocessors. These microprocessors permit the owner of such a game to purchase inexpensive cartridges that can program the processor. Each cartridge contains an electronic micro-circuit, and with a plurality of such cartridges, a player can program a single processor to display hundreds of video games.

One of the problems that has developed in the manufacture and use of these cartridges has been in electrically shielding the electronic micro-circuit. These cartridges are designed to be handled by the players of the game and are therefore subject to the build-up of large potentials of static electricity. Static electricity can discharge into the small traces on the circuit board and either fuse the traces together or destroy them entirely. A TV game cartridge is especially vunerable because it contains at least one read-only memory (ROM) which is highly sensitive to static discharge.

Prior approaches to the problem of shielding these circuits have used shorting bars which short all of the traces together when the circuit is not in use. These shorting bars distribute any static electricity equally across all of the traces and tend to dissipate its effect. A second approach has been to keep the circuit board at least a quarter of an inch away from an opening or any exposed surface of the cartridge. Although static electricity can develop very high potentials, a modest air gap can stop most discharges.

Another problem in the manufacture of TV game cartridges for consumer use has been in designing these cartridges to resist inquisitive tampering and to withstand physical damage to the electronic micro-circuits within the cartridges. Children particularly have an innate desire to open the cartridges and inadvertently damage the traces both on the circuit board and in the connector of the micro-processor.

Prior approaches to combat this problem have relied on designing impenetrable housings and the use of traces and circuit components that can withstand all but malicious damage.

In general, however, no TV game manufacturer has heretofore developed a cartridge that is both relatively tamper proof, resistant to static electricity, and inexpensive to manufacture.

SUMMARY OF THE INVENTION

It is an object of the present invention to provide a novel method and apparatus that overcomes the limitations and disadvantages of the prior art.

A further object of the present invention is to design a cartridge for shielding an electronic micro-circuit from static electricity.

An additional object of the present invention is to design a cartridge and a socket that will resist inquisitive tampering and will prevent damage to the circuit components therein due to the insertion of foreign objects through the access slots.

A further object of the present invention is to provide a cartridge that will keep a read-only memory (ROM) and its associated circuit shielded when not inserted in a TV game and will only expose the circuit when necessary for insertion into the game.

These and other objects are achieved by a cartridge for shielding a portable electronic micro-circuit and for connecting the circuit into a TV game. The apparatus includes a circuit board having an electronic micro-circuit that is protected from static electricity. The circuit board is adapted for connection with an electrical connector in a TV game and has two members for moving aside a protective shield that protects the connector on the TV game. The two members thus expose the connector in the TV game for engagement to the circuit board.

Additional objects and features of the invention will appear from the following description in which the preferred embodiment has been set forth in detail in conjunction with the accompanying drawings.

BRIEF DESCRIPTION OF THE DRAWINGS

FIG. 1 is a perspective view of the front end of a cartridge according to the present invention.

FIG. 2 is a perspective view of the front end of a socket for the cartridge of FIG. 1.

FIG. 3 is a top plan view taken in section along line 3—3 of the cartridge of FIG. 1.

FIG. 4 is a top plan view, in section, taken along line 4—4 of the socket of FIG. 2.

FIG. 5 is a side elevational view taken in section along line 5—5 of the cartridge of FIG. 3.

FIG. 6 is a side elevational view taken in section along line 6—6 of the socket of FIG. 4.

FIG. 7 is an exploded view of the cartridge of FIG. 1.

FIG. 8 is an exploded view of the socket of FIG. 2.

FIGS. 9A, B, and C are diagrammatic, side elevational views, in section, illustrating the mating sequence between the cartridge of FIG. 1 and the socket of FIG. 2.

DESCRIPTION OF THE PREFERRED EMBODIMENT

Referring to FIGS. 1 and 2, the preferred embodiment includes a cartridge 9 which is inserted into a socket 11. The cartridge is portable and contains a circuit board including an electronic micro-circuit. The socket houses a connector which establishes the electrical connection between the circuit board and the microprocessor (not shown) in the TV game cabinet 12.

Referring to FIG. 1, the cartridge 9 includes a top housing 14 that is molded from a high impact resistant material such as acrylonitrile-butadiene-styrene, a terpolymer (ABS). The top housing also serves as a holder into which all of the components of the cartridge are assembled during the manufacturing process.

Mounted within the top housing 14 is a circuit board 16, FIGS. 3, 5. The circuit board is of known construction and has a plurality of traces 17 printed thereon. The traces form electrical leads between the socket 11 and the electronic micro-circuit housed within a metal can 18. The metal can attenuates any RF radiation that may be emitted by the micro-circuit and the read-only memory (ROM) within the metal can. The circuit board is supported above the top housing 14 by a plurality of support ribs 19, FIG. 3. These support ribs develop an air gap between the circuit board and the cartridge so that static electricity is effectively shielded from the electronic micro-circuit. When the circuit board is inserted into the socket 11, the traces 17 along the leading edge 20 of the circuit board protrude beyond the shielding as described in detail below.

Referring to FIGS. 3, 5, 7, the circuit board 16 is protected against physical damage by a latch 22. The latch is fabricated from a very strong, wear-resistant plastic material. The latch has two lateral trunnions 23 about which the latch can be rotated. The latch also includes a lateral channel 27 for receiving a spring 26. As illustrated in FIG. 9A, the spring urges the latch 22 in a counter-clockwise direction about the two trunnions 23 and urges the latch shut as described below. The latch further includes two inclined surfaces 28, FIGS. 3, 9A, that are adapted to be engaged by two complementary projecting members 60 from the socket 11. These members pass through the slide and force the latch to open. It should be noted that the leading edge 20 of the circuit board 16 contacts a mating surface 30, FIG. 9A, on the rear wall of the latch when the latch is shut. Thus, the circuit board maintains the latch in position in the cartridge when the cartridge is disengaged from the socket.

The latch 22 is received in a slide 34, FIGS. 3,5,7. The slide is also fabricated from a high impact resistant plastic. The slide moves relative to the circuit board 16, FIGS. 9A–C and when the cartridge is inserted into the socket 11, the slide retracts into the cartridge to expose the traces 17 on the leading edge 20 of the circuit board. The latch 22 is supported in the slide by two journals 35 which receive the trunnions 23 on the latch. As illustrated in FIG. 9A, the spring 26 urges the latch 22 in a counter-clockwise direction about the journals 35 and causes the latch to seal the cartridge. The slide 34 is mounted in a trackway 38, FIG. 3, in the cartridge which permits the slide to travel between a pair of forward stops 36 and a pair of rear stops 37 that are fabricated in the top housing 14. When the cartridge is removed from the socket 11, the spring 26 urges the latch and, in turn, the slide 34 forward against the forward stops 36. When the cartridge is inserted in the socket, the socket urges the slide rearward in the cartridge to expose the circuit board 16.

Referring to FIG. 1, the slide 34 includes two lateral, elongate slots 39. These slots receive two rectangular members 60 projecting from the socket 11. The two slots 39 are aligned with the two inclined surfaces 28 on the latch 22. To open the latch, the projections from the socket 11 pass through the slots 39 and engage the surfaces 28. The slide also includes a centrally located elongate slot 41 through which the leading edge 20 of the circuit board 16 projects when the slide retracts into the cartridge. The circuit board is rigidly mounted in the cartridge and the slide and latch move with respect to it. When the cartridge is removed from the socket, the slot 41 is covered by the latch 22 and the latch prevents any object from passing through the slot 41 and reaching the traces 17 on the circuit board. Adjacent to the smaller slots 39 are two parallel projecting members 43. These members move aside a shield in the socket and permit the leading edge of the circuit board to pass into the socket and be connected to the connector therein.

Referring to FIGS. 5 and 9A, it should be noted that the axis of the trunnions 23, FIG. 9A, the plane of the circuit board 16, the slots 39, 41, and the two projecting members 43 are all co-planar. Any force directed against the latch 22 while it covers the central slot 41 is resisted by the leading edge 20 of the circuit board 16. The circuit board is held in place by the support ribs 19. Thus, penetration into the cartridge by a foreign object is resisted and the latch cannot be forced open.

The latch 22 is urged shut by the spring 26, FIGS. 5, 7. The free ends of the spring 26 engage the lateral channel 27 in the latch. The spring is a conventional torsion spring with a flat force curve. The spring is held in place by the pins 45 and the member 46 fabricated in the top housing 14. The spring pushes the latch 22 upward around the rotational axis of the trunnions 23 and causes the latch to seal the central slot 41. In addition, the spring urges both the latch and the slide 34 against the forward stops 36 in the top housing 14.

The cartridge 9 is received in the socket 11, FIGS. 2, 4, 6. The socket includes a connector 50 of conventional construction. The connector 50 is bolted to the socket and is electrically connected to the microprocessor (not shown) of the TV game. The connector receives the leading edge 20 of the circuit board 16 through the central slot 58 and makes electrical contact with the traces 17 thereon. The connector 50 is covered by a shield 51 which prevents damage to the connector and also serves as a dust cover. The shield, like the latch 22, prevents the insertion of a foreign object into the access slots 57, 58. The lower edge of the shield has two inclined surfaces 53 which are used in moving the shield aside. The shield is urged downward over the connector 50 by a resilient member 55. Referring to FIG. 2, the socket contains two lateral slots 57 which line up with the inclined surfaces 53 on the shield. These slots are adapted to receive the two parallel projecting members 43 located on the front surface of the slide 34. The front surface of the socket also contains two co-planar rectangular projecting members 60. These projecting members are adapted for passing through the two slots 39, FIG. 1, in the front of the slide 34.

It should be noted from FIGS. 9A–C, that the two projecting members 60 on the socket 11 are dimensioned to pass through the two slots 39 in the slide 34, FIG. 1. In addition, the two projecting members 43 on the front surface of the slide 34 are adapted to pass through the two slots 57 on the front of the socket 11. In addition, the four projecting members and the four complementary slots are keyed so that the cartridge can only be inserted one way into the socket. Thus, the alignment of the circuit board 16 and the connector 50 is preserved.

After the above components have been assembled in the top housing 14, FIG. 3, the bottom housing 64 is snapped into place. The bottom housing is also fabricated from a high impact resistant plastic. The top housing is attached to the bottom housing with a bolt 66 to complete the assembly of the cartridge.

FIGS. 9A, B, and C illustrate the process of mating between the cartridge 9 and the socket 11. FIG. 9A illustrates the cartridge and the socket in separated positions. Typically, the socket is mounted on the cabinet 12 of a TV game and the connector 50 therein is wired to a microprocessor (not shown). Within the socket 11, the resilient member 55 urges the shield 51 upward in a direction to cover the connector 50 and to block the slots 57, 58. Inside the cartridge 9 the spring 26 urges the latch 22 in a counter-clockwise direction around the axis of the trunnions 23. The spring thus causes the latch to cover the central slot 41 and the two smaller slots 39 in the front surface of the slide 34. The spring also urges the slide 34 forward against the forward stop 36 in the top housing 14.

When the cartridge 9 and the socket 11 are brought together for mating as illustrated in FIG. 9B, the forward projecting members 43 on the slide 34 pass through the two slots 57 in the front surface of the socket. These projections 43 engage the inclined surfaces 53 on the shield 51 and cause the shield to be pushed downward. In addition, the two projecting members 60 on the socket pass through the two slots 39 on the slide 34 and engage the two inclined surfaces 38 on the latch 22. These two projecting members 57 cause the latch to rotate about the axis of the trunnions 23 in a clockwise direction and to expose the central slot 41. The four projecting members 43, 60 thus simultaneously push down both the latch 22 and the shield 51.

FIG. 9B illustrates the slide 34 in its forward position against the stops 36 and with the latch 22 in a lowered position. In this position the slide 34 can retract into the cartridge and expose the leading edge 20 of the circuit board 16. In addition, the shield 51 is illustrated in a lowered position ready to permit the circuit board to enter the connector 50.

Next, the slide 34 is forced rearward into the cartridge against the pressure of the spring 26 by the socket 11. The motion of the slide in the trackway of the cartridge 38 exposes the leading edge 20 of the circuit board 16. The circuit board, which is stationary in the cartridge, thereby passes into the connector 50.

FIG. 9C illustrates the cartridge 9 fully mated in the socket 11. The latch 22 is in a lowered position and is urged upward by the spring 26 against the two projecting members 60 that extend from the front of the socket 11. The shield 51 is also in a lowered position. The shield 51 is urged upward by the resilient member 55 against the two projecting members 43 that extend from the front surface of the slide 34. The circuit board 16 passes through the two slots 41, 58 and is engaged by the connector 50. Thus, the microprocessor can incorporate the electronic micro-circuits housed within the metal can 18.

The removal of the cartridge 9 from the socket 11 is merely the inverse of the above-described process. For the sake of brevity the sequence of removal need not be repeated.

It should be noted from FIG. 5 that the latch 22 cannot be opened by an instrument that is pressed normally against the front surface of the slide 34. The latch can only be opened by a projecting member of predetermined size that tends to rotate the latch 22 around the axis of the two trunnions 23. Any force normal to the face of the slide is resisted by the latch and in turn the leading edge 20 of the circuit board 16 which is mounted on the support ribs 19. In FIG. 6 the projecting members 60 that extend from the socket 11 have inclined surfaces that complement the inclined surfaces 28 on the latch. The relative motion of these inclined surfaces causes the latch to rotate about the axis of the trunnions and to open.

The shield 51 in the socket 11 likewise cannot be opened by an instrument pressed normally against the face of the socket. The shield is backed up by the socket 11, FIG. 9A and the connector 50 and thereby resists such a force. In FIG. 6 the projecting members 43 that extend from the front surface of the slide 34 have inclined surfaces that complement the inclined surfaces 53 on the shield. Typically, only relative motion between these surfaces can cause the shield to lower and to expose the connector.

Thus, although the best mode contemplated for carrying out the present invention has been herein shown and described, it will be apparent that modification and variation may be made without departing from what is regarded to be the subject of the invention.

What is claimed is:

1. A cartridge for containing a first electronic circuit and being usable for exposing a set of terminals of the first circuit to permit the first circuit to be electrically connected with a second electronic circuit externally of the cartridge comprising: a housing having a pair of opposed ends, one of the ends of the housing being open; a circuit board mounted in the housing with one end margin of the circuit board being spaced inwardly from the open end of the housing, said circuit board being adapted to support said first electronic circuit and to permit a set of terminals of the first circuit to be located at said one end margin of the circuit board; a slide having an end wall provided with a slot aligned with said circuit board, the slide being shiftably mounted in the housing near said open end thereof for movement from a first position with said one end margin of the circuit board spaced inwardly from the slot to a second position with said one end margin of the circuit board extending through the slot, whereby a set of terminals on said one end margin of the circuit board will be exposed for connection to a second electronic circuit externally of the housing; and means biasing the slide toward said first position.

2. A cartridge as set forth in claim 1, wherein said housing has a pair of spaced stops there being a stop for each of said first and second positions, respectively, said slide being engageable with a stop when the slide is in the corresponding position.

3. A cartridge as set forth in claim 1, wherein said housing has a pair of opposed, spaced sidewalls spanning the distance between the ends of the housing, and including means mounting the circuit board at a location spaced inwardly from the inner surfaces of the side walls.

4. A cartridge as set forth in claim 1, wherein is included a latch shiftably mounted in the housing for movement into and out of location in blocking relationship to the slot, the latch being biased toward the blocking location, there being a second slot in said slide adjacent to the first slot, the latch having a surface aligned with the second slot when the latch is in said blocking location, said second slot adapted to receive an external projection for engaging said surface of the latch to shift the latter out of said blocking location.

5. A cartridge as set forth in claim 4, wherein said biasing means being coupled with said latch to bias the latch toward said blocking location.

6. A cartridge as set forth in claim 5, wherein the latch is pivotally mounted on the slide for rotation about an axis extending transversely of the direction of movement of the slide.

7. A cartridge as set forth in claim 1, wherein the slide has a projection extending outwardly therefrom longitudinally of the path of movement of the slide, the circuit board being generally planar, the projection being generally in the plane of the slot and the circuit board.

8. A cartridge as set forth in claim 1, wherein the slide has an outer face spaced inwardly from the open end of the housing when the slide is in said first position.

9. A cartridge as set forth in claim 1, wherein is included a second housing having an end wall provided with a slot therein, the second housing having a connector adapted to be coupled to said second circuit, the second housing having a size sufficient to permit it to be at least partially inserted into the first-mentioned housing through the open end thereof and to engage and move said slide from said first position to said second position, said one end margin of the circuit board being movable into the second housing through the slot in said end wall thereof and into electrically coupled relationship to the connector as the second housing moves the slide from the first position to the second position.

10. A cartridge as set forth in claim 9, wherein the second housing has a latch shiftably mounted therein for movement from a first location blocking the slot of said end wall of the second housing to a second location out of blocking relationship to the last-mentioned slot, the end wall of the second housing having a second slot adjacent to the first-mentioned slot thereof, the latch being aligned with the second slot when the latch is in said first location, said slide of the first housing having a projection for insertion into the second slot of the second housing for engaging the latch in the second housing to shift the latch from said first location to the second location as the second housing is inserted into the open end of the first housing.

11. A cartridge as set forth in claim 10, wherein the first housing has a latch shiftably mounted therein for movement from a first location blocking the slot of the slide to a second location out of blocking relationship to the slot of the slide, the slide having a second slot adjacent to the first slot, said end wall of the second housing having a projection for insertion into the second slot of the slide for engaging the latch in the first housing to shift the latch of the first housing out of blocking relationship to the slot in the slide when the second housing enters the first housing through the open end thereof.

* * * * *